United States Patent [19]

Naito et al.

[11] Patent Number: 5,055,717
[45] Date of Patent: Oct. 8, 1991

[54] DATA SELECTOR CIRCUIT AND METHOD OF SELECTING FORMAT OF DATA OUTPUT FROM PLURAL REGISTERS

[75] Inventors: Atsushi Naito; Kiyoshi Nakatsuka; Seiichi Yamamoto; Takashi Inui; Tomohiro Suzuki, all of Miho, Japan

[73] Assignee: Texas Instruments Incorporated, Dallas, Tex.

[21] Appl. No.: 398,339

[22] Filed: Aug. 24, 1989

Related U.S. Application Data

[63] Continuation of Ser. No. 53,287, May 22, 1987, abandoned.

[30] Foreign Application Priority Data

May 30, 1986 [JP] Japan ................. 61-125454

[51] Int. Cl.$^5$ ............................................. H03M 9/00
[52] U.S. Cl. ................................... 307/463; 341/100; 341/101; 365/219
[58] Field of Search ......................... 341/100, 101, 106; 307/463; 365/219

[56] References Cited

U.S. PATENT DOCUMENTS

| | | | |
|---|---|---|---|
| 3,631,465 | 12/1971 | Heeren | 307/463 |
| 3,863,226 | 1/1975 | Ryburn | 341/100 |
| 3,898,632 | 8/1975 | Spencer, Jr. | 365/219 |
| 3,914,553 | 10/1975 | Melindo et al. | 341/100 |
| 4,048,626 | 9/1977 | Fett | 307/463 |
| 4,247,921 | 1/1981 | Itoh et al. | 307/463 |
| 4,356,413 | 10/1982 | Rosenbluth et al. | 307/463 |
| 4,425,562 | 1/1984 | DeNiet | 341/100 |
| 4,447,804 | 5/1984 | Allen | 341/100 |
| 4,450,538 | 5/1984 | Shirasaka | 365/219 |
| 4,453,236 | 6/1984 | Uratani et al. | 307/463 |
| 4,544,916 | 10/1985 | Sharper | 341/101 |
| 4,567,579 | 1/1986 | Patel et al. | 365/189 |
| 4,618,947 | 10/1986 | Tran et al. | 365/230 |
| 4,654,827 | 5/1987 | Childers | 365/201 |
| 4,658,377 | 4/1987 | McElroy | 365/149 |
| 4,661,930 | 4/1987 | Tran | 365/201 |
| 4,670,878 | 6/1987 | Childers | 365/201 |
| 4,685,089 | 8/1987 | Patel et al. | 365/233 |

FOREIGN PATENT DOCUMENTS 2573939 5/1986 France .................. 307/272.2

Primary Examiner—Timothy P. Callahan
Attorney, Agent, or Firm—William E. Hiller; N. Rhys Merrett; Melvin Sharp

[57] ABSTRACT

Data selector circuit including a plurality of data registers connected in parallel via corresponding output buffers to a plurality of output drivers, wherein a decoder and selector portion is interposed between the output buffers and the output drivers for selectively providing one of a plurality of serial data output sequences from the data registers to the output drivers rather than a parallel data output format from the plurality of data registers which would otherwise occur. The decoder and selector portion is controlled by a partial address buffer which is provided with serial sequence selection data. Upon decoding the serial sequence selection data of the partial address buffer, a plurality of MOS transistors included in the selector portion are rendered conductive in sequence in response to respective control signals applied to the gates thereof to connect the plurality of data registers via their output buffers to respective output drivers in a sequence determined by the decoded selection data of the partial address buffer for serial data output in the selected serial data output sequence.

12 Claims, 3 Drawing Sheets

DATA SELECTOR CIRCUIT AND METHOD OF SELECTING FORMAT OF DATA OUTPUT FROM PLURAL REGISTERS

This application is a continuation of application Ser. No. 053,287, filed May 5, 1987, now abandoned.

BACKGROUND OF THE INVENTION

1. Field of the Invention

The present invention relates to data selector circuit.

2. Description of the Prior Art

A multiport video memory such as a 256K bit video RAM (Random Access Memory) is used of for computer graphgics, the combination of a Dynamic RAM and a data register. It is very difficult to control a display of the size more than 1024×1024 dots, for example, 1024×1280 dots when this video memory is used. Particularly, there is no effective means until now which gives an output of 1024 bits by processing data of 256 bits four times.

OBJECTS AND SUMMARY OF THE INVENTION

An object of the present invention is to provide a data selector circuit which can process data from plural parallel registers.

The present invention provides a data selector circuit having a selector which selectively outpus serial data respectively from a plurality of data registers positioned in parallel with each other.

Other objects, features and advantages of the invention will appear more fully from the following detailed description of the preferred embodiment taken in connection with the accompanying drawings.

BRIEF DESCRIPTION OF THE DRAWINGS

FIG. 3 is a block diagram showing parallel and serial methods of retrieving data.

FIG. 5 is an equivalent circuit diagram of a shift register circuit, and

FIG. 6 is a timing diagram of the clocks signals of FIG. 5.

DESCRIPTION OF THE PREFERRED EMBODIMENTS

Figure 1:
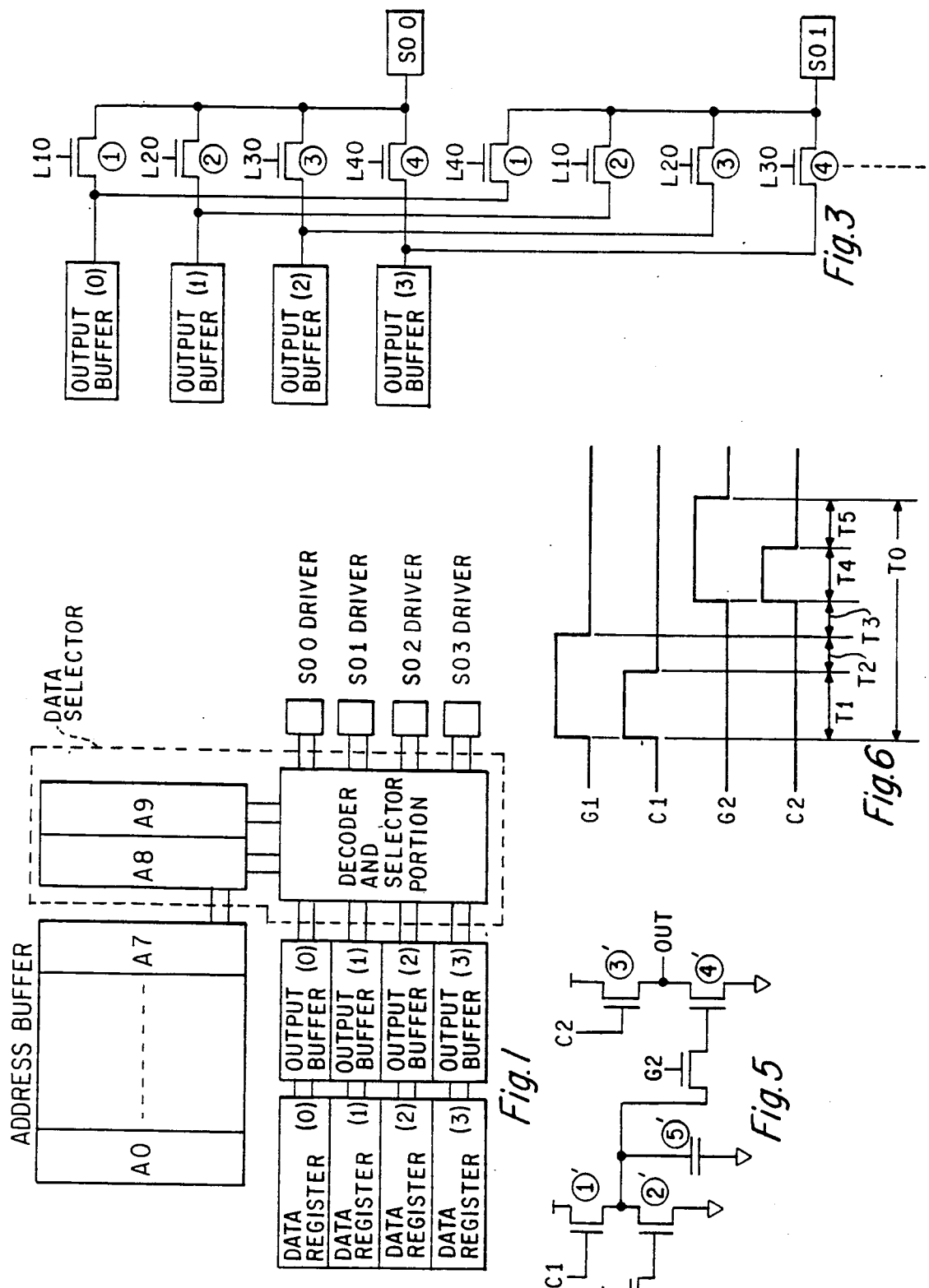
FIG. 1 is a block diagram of a principal part of a video memory.

FIG. 1 schematically illustrates the principal part of a 256K bit video RAM having a data selector based on the present invention.

A data selector enclosed by broken-lines includes addresses A8 and A9 which are added to serial address buffers A0–A7 as an additional upper two bits; a decoder and selector decodes the additional bits. This decoder and selector is positioned between output buffers (0), (1), (2) and (3) of data registers (0), (1), (2) and (3) and output drivers SO0, SO1, SO2 and SO3 respectively.

Figure 2:
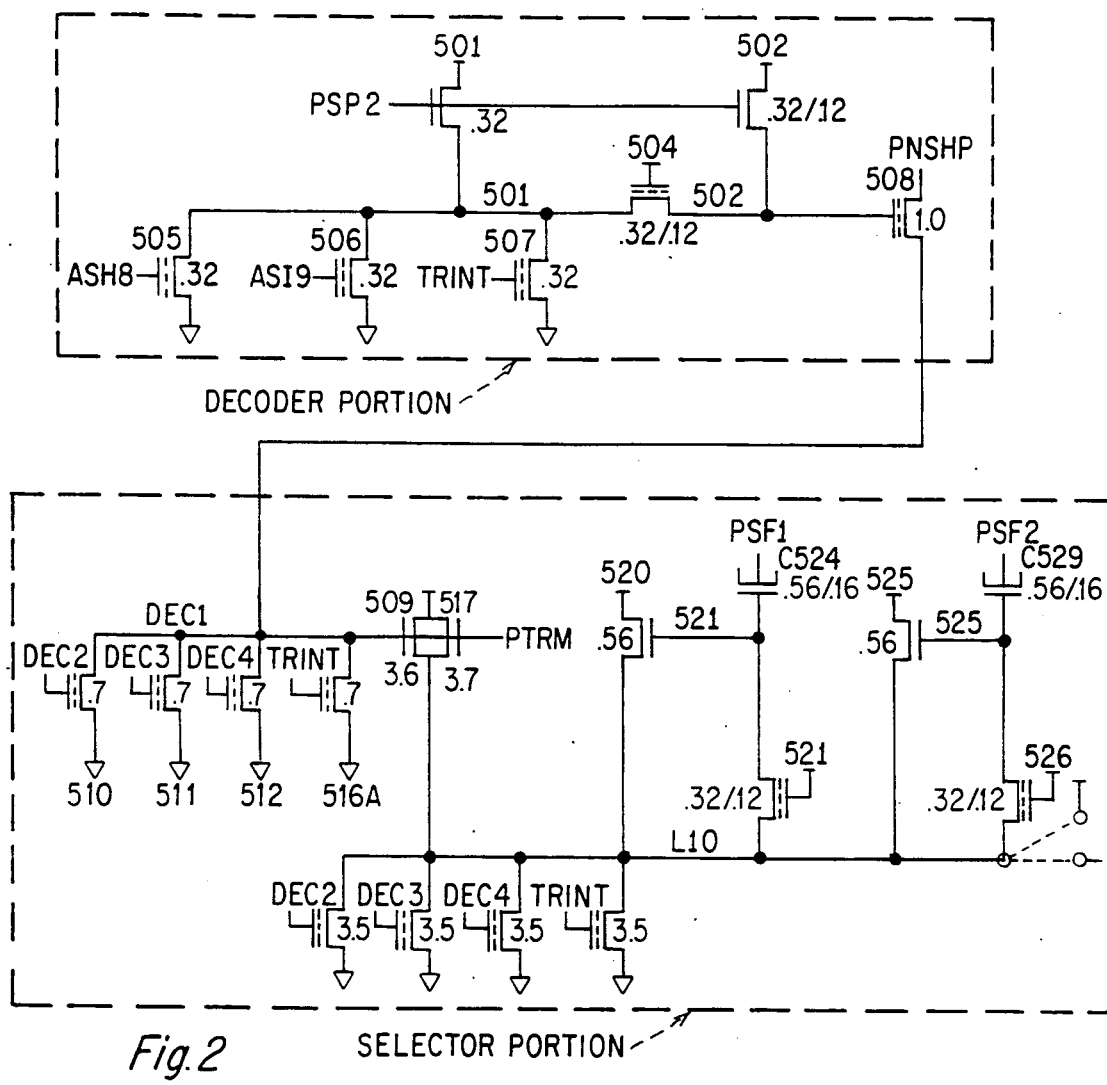
FIG. 2 is an equivalent circuit diagram of a decoder and a selector.

A decoder and selecteer are constructed, as indicated in FIG. 2, so that a signal ASH8 from the address buffers A8 and A9 is supplied to a decoder portion. The selector portion provides as an output, for a control signal L10. Control signals L20, L30 and L40, are provided by similar decoder and selector portions which are not shown because they are basically the same as the decoder and selector portions of FIG. 2.

These control signals, as indicated in FIG. 3, are supplied selectively to each gate of transfer gates 1, 2, 3 and 4 which are positioned between the output buffers (0), (1), (2) and (3) and the output drivers SO0, SO1, SO2 and SO3. When the control signals L10, L20, L30 and L40 are sequentially switched to each one of the gates 1, 2, 3 and 4; respective data registered in the data register (0), the data register (1), the data register (2) and the data register (3) is taken out successively in series starting with the output driver SO0. A data word of 1024 bits (256 bits +256 bits +256 bits +256 bits) can be given as an output at SO0. This operation is the same for outputs SO1-SO3, for example, if the data registered in the data registers (1), (2), (3) and (0) are output successively in series by 1024 bits ×1.

When the control signals are not switched as described above, the data of 256 bits is provided as an output at each output driver. Thus, a data word of 256 bits ×4 as a whole in parallel.

The above operation is explained in more detail as follows:

(1) In the initial state, the additional buffers A8 and A9 are set up as "A9:A8"="0.0".

(2) When all of the buffers A0 to A7 become "1", the additional buffer A8 is set at an increment state.

(3) The signals of the additional buffers A8 and A9 are decoded, and the output buffers are connected with the output drivers as follows:

---

"A9:A8" = "0 0"
    (L10 is the output)
    → the output buffer (0) → SO (0)
    → the output buffer (1) → SO (1)
    → the output buffer (2) → SO (2)
    → the output buffer (3) → SO (3)

"A9:A8" = "0 1"
    (L20 is the output)
    → the output buffer (0) → SO (1)
    → the output buffer (1) → SO (2)
    → the output buffer (2) → SO (3)
    → the output buffer (3) → SO (0)

"A9:A8" = "1 0"
    (L30 is the output)
    → the output buffer (0) → SO (2)
    → the output buffer (1) → SO (3)
    → the output buffer (2) → SO (0)
    → the output buffer (3) → SO (1)

"A9:A8" = "1 1"
    (L40 is the output)
    → the output buffer (0) → SO (3)
    → the output buffer (1) → SO (0)
    → the output buffer (2) → SO (1)
    → the output buffer (3) → SO (2)

---

As described above, by using a data selector circuit bsed on the present invention for a devices such as a video memory it is possible to selectively retrieve the parallel data from plural (four in the above example) parallel data registers and to retrieve a data word? such as 1024 bits ×1; in the above example from the serially connected data registers. In other words, it is possible to effectively switch between 256 bits ×4 in parallel format and 1024 bits ×1, so that a large size display can easily be realized. Moreover, the switching speed is fast and the operation is stable even when there is a long interval between switching.

Figure 4:
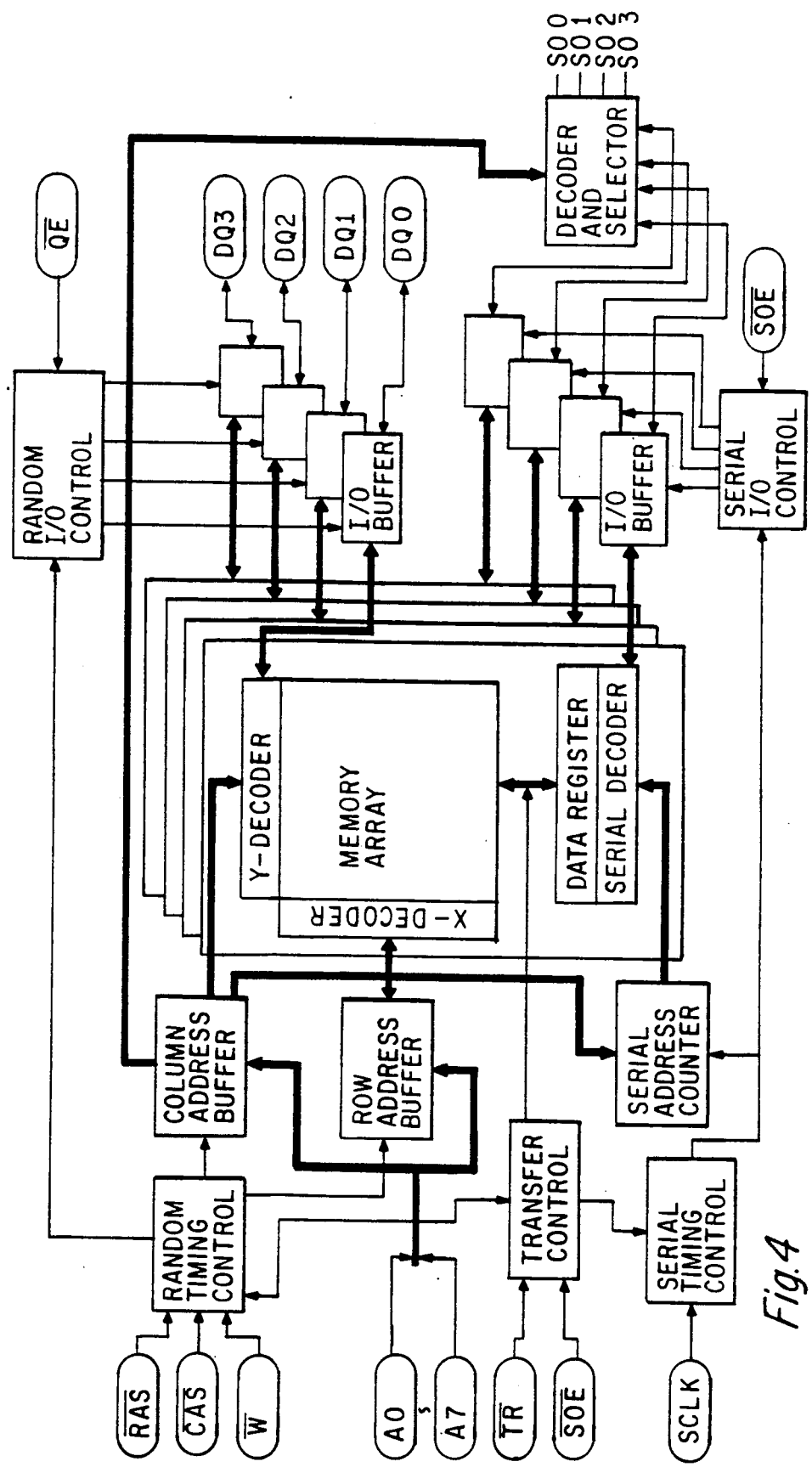
FIG. 4 is a block diagram of a video memory.

FIG. 4 illustrates the combination of the above described data selector and a video memory (RAM). In this video memory system, the address buffers A0-A9 shown in FIG. 1 are used as a column address buffer, outputs therefrom are supplied to a decoder portion of a data selector, and outputs of a data register are supplied to a selector portion through an output buffer.

FIG. 5 and FIG. 6 illustrates an embodiment of the present invention.

In this example, a shift register circuit is used to provide outputs by serially connecting the above described parallel data registers.

A video memory works at a high speed. It is therefore necessary to transfer data from an IN terminal to an OUT terminal in 33 nsec, a fast cycle and to hold the data on the OUT terminal for 10 $\mu$sec $\times$ 256 = 2.56 msec, a long cycle. FIG. 6 indicates a timing chart of clocks. In the case T0=33 nsec, and T1=T2=T3=T4=T5=X, X equals 6.6 nsec. Therefore, to obtain an output in 6.6 nsec, a transistor 3' is made large in size and a transistor 4' is sufficiently larger in size than the transistor 3'. In this example, through-current flows through the transistor 3' and the transistor 4' when the gate of the transistor 4' is "H" (high), and capacitance of the transistor 5' is made sufficiently large when the size of the transistor 4' is large. Similarly, through-current flows through the transistor 1' and 2' when IN is "H". It can hold an output for 2.56 msec, and the output is preserved by the capacitance of the shift register circuit. It is necessary to generate the clocks of G1, C1, G2 and C2.

Compared to this example, in the preferred embodiments described in FIG. 1 to FIG. 4, The problems of the through-current as above described and the unstable factor, coupling, or change of charge by leakage of the capacitance OUT the OUT side do not occur, and the timing of the clocks can easily be achieved.

It will be evident that various modifications can be made to described embodiments without departing from the scope of the present invention.

For example, in FIG. 1, the number of data registers can be changed, and data processing in wide range can be achieved by adding or substracting the number of address buffers depending upon the number of the data registers required for decoding. In this case, the added number of the address buffers may be when the number of data registers is $2^n$. In the example of FIG. 1, control of the output of the data registers via the output buffers may be accomplished as shown in FIG. 3. Such a method of control can also be modified.

What is claimed is:

1. A data selector circuit for selecting the data format for the outputting of data comprising:
    a plurality of registers for storing data to be output;
    first address buffer means operatively connected to said plurality of registers for addressing the plurality of registers to provide the address location of data within each of the plurality of registers;
    a plurality of output terminals for receiving data to be output from said plurality of registers;
    second address buffer means for storing selection data therein determinative of respective connections between the outputs of each of said plurality of registers and each of said plurality of output terminals; and
    selector means coupled to said second address buffer means for identifying specific selection data as stored therein and operatively arranged for connecting predetermined respective registers of said plurality of registers to predetermined respective output terminals of said plurality of output terminals, The predetermined connections being controlled by the specific selection data stored in said second address buffer means as identified by said selector means.

2. A data selector circuit according to claim 1 further comprising means for providing selection data to said second address buffer means whereby output data from the plurality of registers is provided in a serial data format at a preselected one of the plurality of output terminals.

3. A data selector circuit according to claim 1 further comprising means for providing selection data to said second address buffer means whereby output data from the plurality of registers is provided in a parallel data format at the plurality of data output terminals.

4. A data selector circuit according to claim 1 wherein the number of said plurality of registers is equal to $2^n$ wherein n is the number of bits positions in said second address buffer means.

5. a method of selecting the data format for the outputting of data comprising:
    storing data to be output in a plurality of registers;
    providing the address location within each of the plurality of registers in which output data is stored in a first address buffer operatively connected to address the plurality of registers;
    storing specific selection data in a second address buffer, wherein the specific selection data stored is part of a complete set of selection data determinative of respective connections between the outputs of each of the plurality of registers and each of a plurality of output terminals;
    connecting predetermined respective registers of the plurality of registers to predetermined respective output terminals of the plurality of output terminals according to the specific selection data stored in the second address buffer; and
    providing the output data from the plurality of registers to predetermined respective ones of said plurality of output terminals as determined by the specific data in a selected data format.

6. A method according to claim 5 further comprising the step of providing generating the specific selection data for the second address buffer whereby data from the plurality of registers is provided in a serial data format at a preselected one of the plurality of output terminals.

7. A method according to claim 5 further comprising the step of providing the specific selection data for the second address buffer whereby data from the plurality of registers is provided in a parallel data format at the plurality of output terminals.

8. A data selector circuit according to claim 1, further including output buffers respectively corresponding to each of said plurality of registers, each of said output buffers being connected to the register corresponding thereto and providing the output data therefrom; and
    said selector means being interposed between said output buffers and said plurality of output terminals for connecting predetermined respective output buffers to predetermined respective output terminals in accordance with the specific selection data stored in said second address buffer means.

9. A data selector circuit according to claim 1, wherein said first and second address buffer means cooperate to define a composite address relating to said plurality of registers and comprising a plurality of bit positions in which binary data is storable, the total number of bit positions in the composite address resulting from the addition of the bit positions of said first and second address buffer means;

said first address buffer means having a plurality of bit positions in which binary data is storable for providing the address location of data within each of the plurality of registers;

said second address buffer means having n bit positions in which binary data is storable as specific selection data defining a code determining which ones of the plurality of registers are to be connected to which respective output terminals; and the number of said plurality of registers being equal to $2^n$.

10. A data selector circuit according to claim 9, wherein the n bit positions of said second address buffer means are the leading bit positions in the total number of bit positions defining the composite address provided by said first and second address buffer means.

11. A data selector circuit according to claim 10, further comprising means for providing selection data to said second address buffer means whereby output data from the plurality of registers is provided in a serial data format at a preselected one of the plurality of output terminals.

12. A data selector circuit according to claim 10, further comprising means for providing selection data to said second address buffer means whereby output data from the plurality of registers is provided in a parallel data format at the plurality of output terminals.

* * * * *